(12) United States Patent
Levy

(10) Patent No.: US 12,117,737 B2
(45) Date of Patent: Oct. 15, 2024

(54) APPARATUS AND METHOD FOR CLEANING A SUPPORT STRUCTURE IN A LITHOGRAPHIC SYSTEM

(71) Applicant: ASML Holding N.V., Veldhoven (NL)

(72) Inventor: Keane Michael Levy, Wilton, CT (US)

(73) Assignee: ASML HOLDING N.V., Veldhoven (NL)

( * ) Notice: Subject to any disclaimer, the term of this patent is extended or adjusted under 35 U.S.C. 154(b) by 483 days.

(21) Appl. No.: 17/418,487

(22) PCT Filed: Dec. 18, 2019

(86) PCT No.: PCT/EP2019/085853
§ 371 (c)(1),
(2) Date: Jun. 25, 2021

(87) PCT Pub. No.: WO2020/136048
PCT Pub. Date: Jul. 2, 2020

(65) Prior Publication Data
US 2022/0066332 A1    Mar. 3, 2022

Related U.S. Application Data
(60) Provisional application No. 62/786,161, filed on Dec. 28, 2018.

(51) Int. Cl.
*G03F 7/00*    (2006.01)
(52) U.S. Cl.
CPC ...... *G03F 7/70733* (2013.01); *G03F 7/70716* (2013.01); *G03F 7/70925* (2013.01)
(58) Field of Classification Search
CPC ............. G03F 7/70733; G03F 7/70716; G03F 7/70925; G03F 7/707; B08B 7/0014; B08B 7/0028
See application file for complete search history.

(56) References Cited

U.S. PATENT DOCUMENTS 4,551,192 A  *  11/1985  Di Milia ............. H01L 21/6875
                                                  216/2
5,849,139 A  *  12/1998  Miyakawa .......... H01L 21/6838
                                                  414/941
(Continued)

FOREIGN PATENT DOCUMENTS

EP          1 840 657 A1    10/2007
JP          2004-241568 A    8/2004
WO      WO 2013/083332 A1    6/2013

OTHER PUBLICATIONS

International Search Report and Written Opinion of the International Searching Authority directed to related International Patent Application No. PCT/EP2019/085853, mailed Apr. 17, 2020; 12 pages.

(Continued)

*Primary Examiner* — Seahee Hong
(74) *Attorney, Agent, or Firm* — Sterne, Kessler, Goldstein & Fox P.L.L.C.

(57) ABSTRACT

Apparatus for and method of removing a contaminant from a working surface of a lithography support such as a reticle or wafer stage in an EUV or a DUV photolithography system in which a base supporting the substrate is provided with a surface profile so as to be thicker towards a middle portion of the base so that when a substrate supported by the base is pressed between the working surface and the base the contaminant is transferred from the working surface to the substrate.

12 Claims, 9 Drawing Sheets

(56) References Cited

U.S. PATENT DOCUMENTS

| | | | | |
|---|---|---|---|---|
| 7,909,374 | B2* | 3/2011 | Thallner | H01L 21/6838 |
| | | | | 294/212 |
| 9,268,241 | B2 | 2/2016 | Lansbergen et al. | |
| 9,946,173 | B2* | 4/2018 | Funayoshi | G03F 7/0002 |
| 10,118,381 | B2* | 11/2018 | Kreindl | B44B 5/0052 |
| 10,248,018 | B2* | 4/2019 | Schumaker | G03F 7/0002 |
| 2006/0130678 | A1* | 6/2006 | Sewell | B82Y 10/00 |
| | | | | 101/34 |
| 2006/0162739 | A1* | 7/2006 | Sogard | G03F 7/70925 |
| | | | | 134/1 |
| 2008/0257383 | A1 | 10/2008 | Levinson | |
| 2010/0170533 | A1* | 7/2010 | Terada | B82Y 40/00 |
| | | | | 15/159.1 |
| 2012/0024318 | A1* | 2/2012 | Itoh | B08B 7/0028 |
| | | | | 134/6 |
| 2013/0056904 | A1* | 3/2013 | Hamaya | G03F 7/0002 |
| | | | | 264/293 |
| 2014/0326278 | A1* | 11/2014 | Kobayashi | B08B 7/0028 |
| | | | | 15/104.002 |
| 2015/0107621 | A1* | 4/2015 | Kobayashi | B08B 7/0028 |
| | | | | 15/104.002 |
| 2016/0297136 | A1* | 10/2016 | Wakabayashi | B29C 64/00 |

OTHER PUBLICATIONS

International Preliminary Report on Patentability directed to related International Patent Application No. PCT/EP2019/085853, issued Jun. 16, 2021; 9 pages.

* cited by examiner

APPARATUS AND METHOD FOR CLEANING A SUPPORT STRUCTURE IN A LITHOGRAPHIC SYSTEM

CROSS-REFERENCE TO RELATED APPLICATIONS

This application claims priority of U.S. Provisional Patent Application No. 62/786,161, which was filed on Dec. 28, 2018, and which is incorporated herein in its entirety by reference.

FIELD

The present disclosure relates to cleaning of devices used to hold a reticle, mask, wafer, or other substrate in a photolithographic apparatus.

BACKGROUND

A lithographic apparatus applies a desired pattern onto a substrate such as a wafer of semiconductor material. A patterning device, such as a mask or a reticle, may be used to generate a circuit pattern to be formed on an individual layer of the wafer. Transfer of the pattern is typically accomplished by imaging onto a layer of radiation-sensitive material (resist) provided on the substrate. In general, a single substrate will contain adjacent target portions that are successively patterned.

The lithographic apparatus includes a support structure (e.g., a reticle clamp) having a working surface configured to hold the patterning device using, for example, electrostatic or other clamping techniques. The support structure may include burls configured to support corresponding portions of the wafer. The surface of each of the burls that faces the patterning device may include a formation of patterned bumps having dimensions on the order of nanometers. These bumps are referred to as nanobumps herein. The nanobumps define a reduced contacting surface area between the patterning device and the burls. The reduced contacting surface area mitigates any sticking effect between the patterning device and the burls and modifies friction during the clamping process.

During use, the front working surface of the reticle clamp may become contaminated with particulate matter. If this contamination is not addressed the particles may transfer to the patterning device and lead to flaws in transfer of the patterns to the wafer and so to defects in the resulting devices. The accumulated contamination may be cleaned away by removing the working surface from its operational environment (a shift out) and using chemicals to "wet clean" the working surface by dissolving the contamination. It is desirable, however to avoid these steps and the attendant downtime and instead to be able to clean the working surface in-situ.

SUMMARY

The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments. Its sole purpose is to present some concepts of one or more embodiments in a simplified form as a prelude to the more detailed description that is presented later.

According to one aspect of an embodiment, the cleaning substrate is provided with an upward or convex curve (middle higher than the periphery) so that greater mechanical force can be applied to an interface between the cleaning substrate and a reticle clamp to promote cleaning of the working surface of the reticle clamp.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWING

The accompanying drawings, which are incorporated herein and form part of the specification, illustrate the present invention and, together with the description, further serve to explain the principles of the present invention and to enable a person skilled in the relevant art(s) to make and use the present invention.

Figure 1:
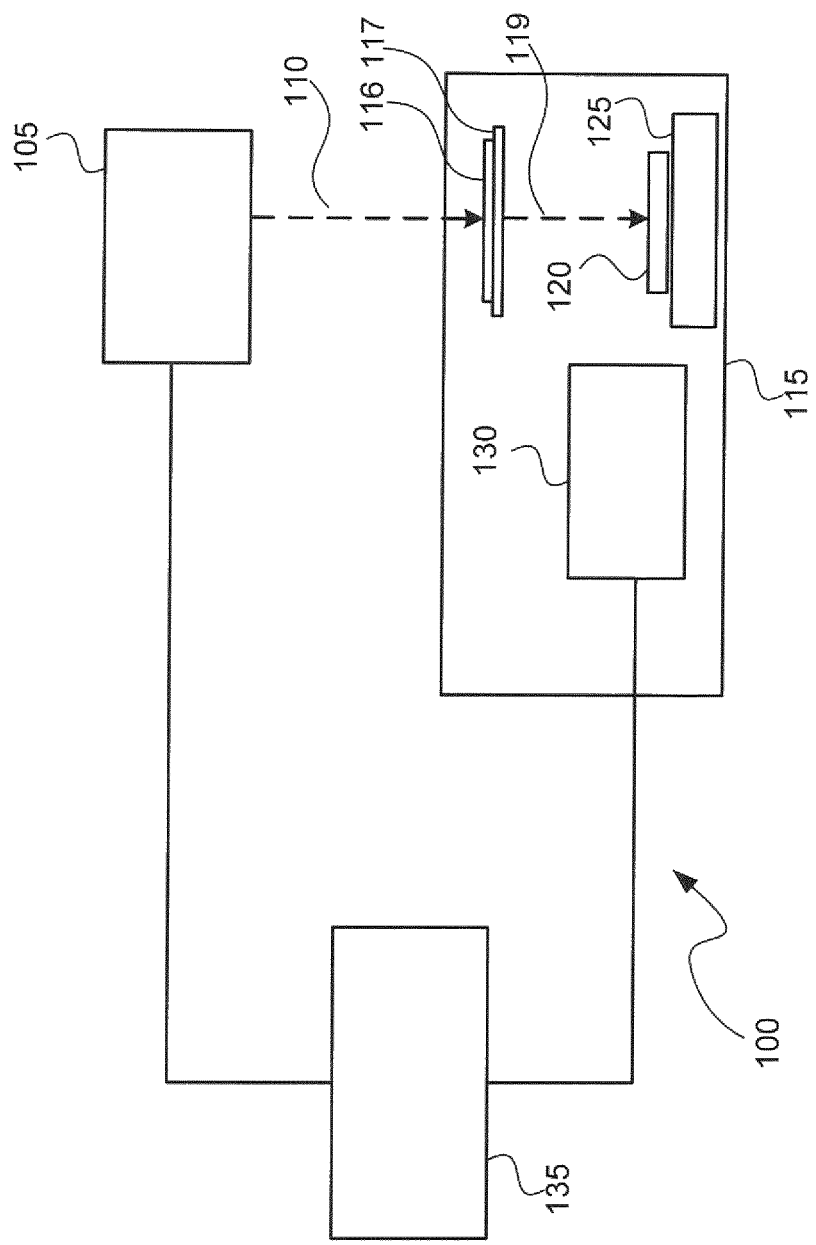
FIG. 1 shows a lithographic apparatus according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

In the description that follows and in the claims the terms "up," "down," "top," "bottom," "vertical," "horizontal," and like terms may be employed. These terms are intended to show relative orientation only and not any orientation with respect to gravity. Similarly, terms such as left, right, front, back, etc., are intended to give only relative orientation.

Before describing embodiments in more detail, it is instructive to present an example environment in which embodiments of the present invention may be implemented.

Referring to FIG. 1, a photolithography system 100 that includes an illumination system 105. The illumination system 105 includes a light source that produces a pulsed light beam 110 and directs it to a photolithography exposure apparatus or scanner 115. The scanner 115 includes a patterning device 116, for example, a mask or reticle, on a support structure 117. The patterning device 116 carries a pattern that is transferred to the beam 110 to create patterned beam 119 that patterns microelectronic features on a wafer 120. The wafer 120 is placed on a wafer table 125 constructed to hold wafer 120 and connected to a positioner configured to accurately position the wafer 120 in accordance with certain parameters.

The photolithography system 100 may use a light beam 110 having a wavelength in the deep ultraviolet (DUV) range, for example, with wavelengths of 248 nanometers (nm) or 193 nm. The size of the microelectronic features patterned on the wafer 120 depends on the wavelength of the light beam 110, with a lower wavelength resulting in a smaller minimum feature size. Alternatively, photolithography system 100 may use a light beam 110 having a wavelength in the extreme ultraviolet (EUV) portion of the spectrum, e.g., electromagnetic radiation having wavelengths of around 50 nm or less (also sometimes referred to as soft x-rays), and including light at a wavelength of about 13.5 nm. Here and elsewhere herein the term "light" is used even though it is understood that the radiation described using that term may not in the visible part of the spectrum. Methods for generating EUV light include converting a target material from a liquid state into a plasma state. The target material preferably includes at least one element, e.g., xenon, lithium or tin, with one or more emission lines in the EUV range. In one such method, often termed laser produced plasma ("LPP"), the required plasma can be produced by using a laser beam to irradiate a target material having the required line-emitting element.

The scanner 115 includes an optical arrangement having, for example, one or more condenser lenses, and an objective arrangement. The patterning device 116 is movable along one or more directions, such as along an optical axis of the light beam 110 or in a plane that is perpendicular to the optical axis. The objective arrangement includes a projection lens and enables the image transfer to occur from the patterning device 116 to the photoresist on the wafer 120. The illumination system 105 adjusts the range of angles for the light beam 110 impinging on the mask. The illumination system 105 also homogenizes (makes uniform) the intensity distribution of the light beam 110 across the mask.

The scanner 115 can include, among other features, a lithography controller 130, air conditioning devices, and power supplies for the various electrical components. The lithography controller 130 controls how layers are printed on the wafer 120. The lithography controller 130 includes a memory that stores information such as process recipes. A process program or recipe determines the length of the exposure on the wafer 120, the reticle used, as well as other factors that affect the exposure. During lithography, a plurality of pulses of the light beam 110 illuminate the same area of the wafer 120 to constitute an illumination dose.

The photolithography system 100 also preferably includes a control system 135. In general, the control system 135 includes one or more of digital electronic circuitry, computer hardware, firmware, and software. The control system 135 also includes memory which can be read-only memory and/or random access memory. Storage devices suitable for tangibly embodying computer program instructions and data include all forms of non-volatile memory, including, by way of example, semiconductor memory devices, such as EPROM, EEPROM, and flash memory devices; magnetic disks such as internal hard disks and removable disks; magneto-optical disks; and CD-ROM disks.

The support structure 117 holds the patterning device 116 in a manner that depends on the orientation of the patterning device, the design of the lithographic apparatus, and other conditions, such as for example whether or not the patterning device is held in a vacuum environment. The support structure 117 can use mechanical, vacuum, electrostatic or other clamping techniques to hold the patterning device. The support structure 117 may be a frame or a table, for example, which may be fixed or movable as required. The support structure 117 may ensure that the patterning device 116 is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. As here depicted, the patterning device 116 is of a transmissive type (e.g., employing a transmissive mask). Examples of patterning devices include masks, programmable mirror arrays, and programmable LCD panels. Masks include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern to a radiation beam that is reflected by the mirror matrix.

The projection system, like the illumination system, may include various types of optical components, such as refractive, reflective, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps.

Using reticles as an example of a patterning device, in the scanner 115 the reticles are transported by reticle exchange device such as that disclosed in U.S. Pat. No. 9,268,241 B2, "Rapid Exchange Device for Lithography Reticles", issued Feb. 23, 2016, the entirety of which is hereby incorporated by reference herein. Such devices have the capability of applying as much as 200 N of force at the interface of the reticle and the reticle clamp. These reticle exchange devices may include a module for transporting the reticles, referred to as a pod. The pod may include a base plate which supports the reticle. When the reticle reaches a position for loading onto the reticle electrostatic clamp, the clamp is energized securing the reticle to the clamp by electrostatic force.

Figure 2:
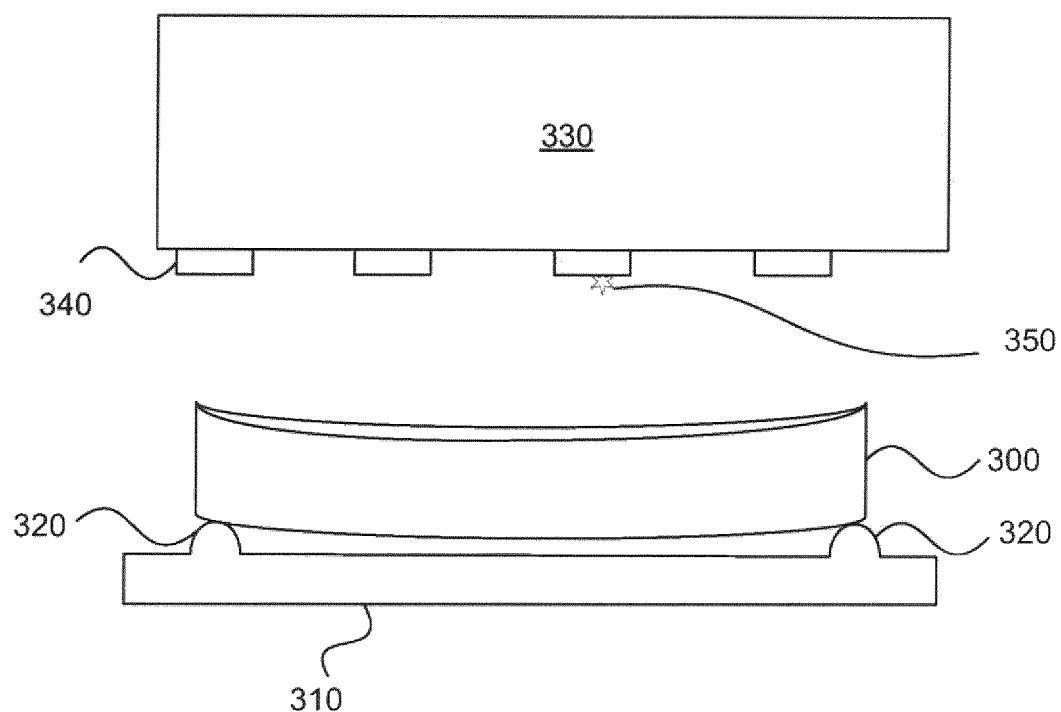
FIG. 2 is a not-to-scale diagram of a reticle and a reticle clamp.

As shown in FIG. 2, the reticle 300 as it rests on the pod base plate 310 is supported at the corners of the base plate by peripheral protrusions 320. The reticle exchange device transports the reticle 300 to a position facing a working surface of a reticle clamp 330. The working surface of the reticle clamp 330 may be supplied with an ordered or disordered (random) array of burls 340, and the top surface (that is, the surface intended to come into contact with the patterning device) of each of the burls may be supplied with nanoscale structures, that is, structures having a feature size on the order on a nanometer or tens of nanometers. The manner in which the reticle 300 is supported at its periphery permits the reticle 300 to sag at its middle as shown in FIG. 2. This sag is on the order of about 200 microns and is much greater that the magnitude of the peak-to-valley (PV) flatness of the reticle clamp 330 which is typically less than about 50 nm.

Also visible in FIG. 2 is a contaminant depicted as a particle 350. The particle 350 may be made, for example, of chromium which has adhered to the nanobump surface after being transferred from, for example, a reticle. Particle 350 typically has a size on the order of five microns or smaller. Particles can be removed from the front surface of the clamp by causing a substrate dedicated to cleaning, referred to generically herein as a cleaning reticle or a cleaning substrate, to be pressed against the clamp surface through the application of a clamping force. The particles transfer from the clamp surface to the cleaning reticle and remain on the cleaning reticle when the clamping force is removed and the cleaning reticle is moved away from the clamp.

This transfer improves with the amount of clamping force that is applied. There are, however, limits to the amount of compressive force that can be generated at the interface between the working surface of the reticle clamp and the cleaning reticle. As mentioned, it is necessary to avoid amounts of compressive force that would damage the reticle, the clamp, or components of the reticle exchange system. The amount of force that can be applied by an electrostatic clamp is limited by several factors including limits on the magnitude of the maximum voltage that can be applied before dielectric breakdown. The electrostatic clamps, however, are mechanically robust, and can tolerate higher forces than they typically encounter during electrostatic clamping. For example, they can withstand the higher forces associated with vacuum clamping during various procedures.

Figure 3:
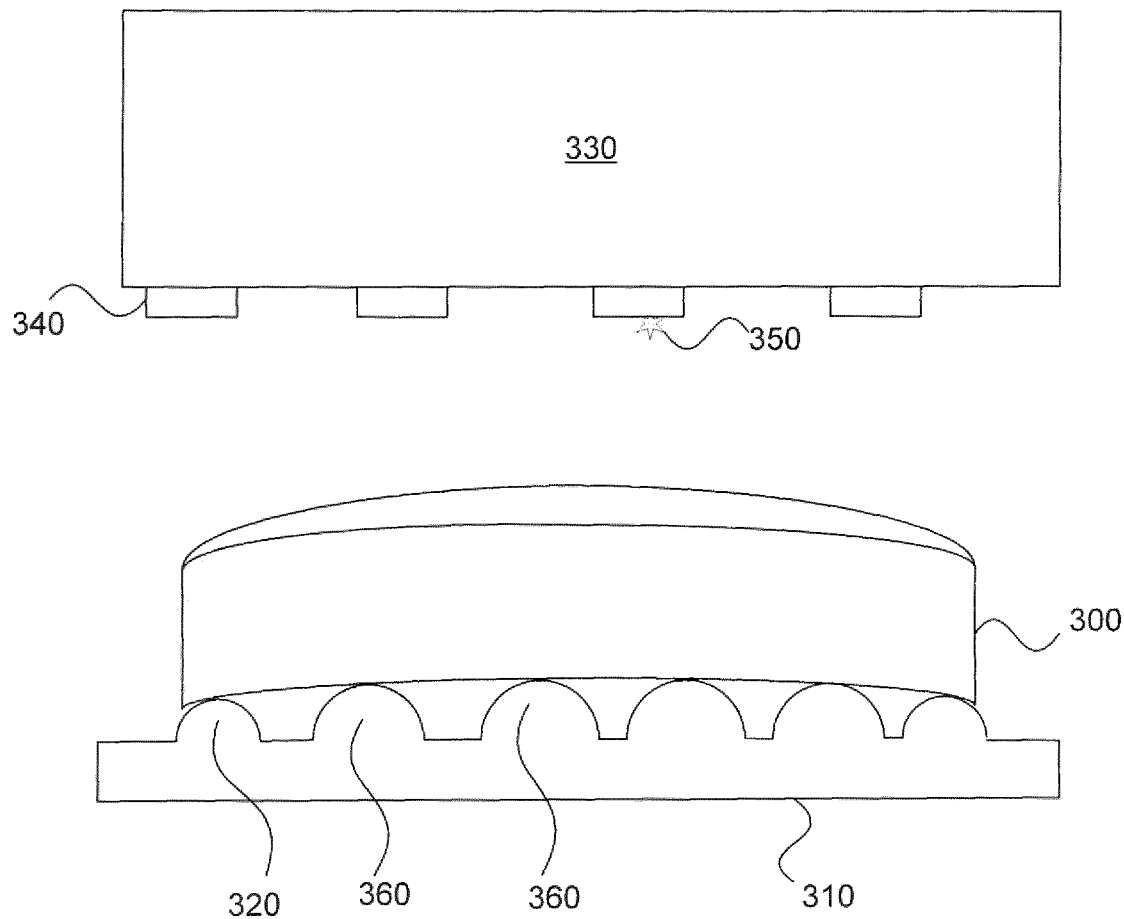
FIG. 3 is a not-to-scale diagram of a reticle and a reticle clamp according to an aspect of an embodiment.
Figure 5:
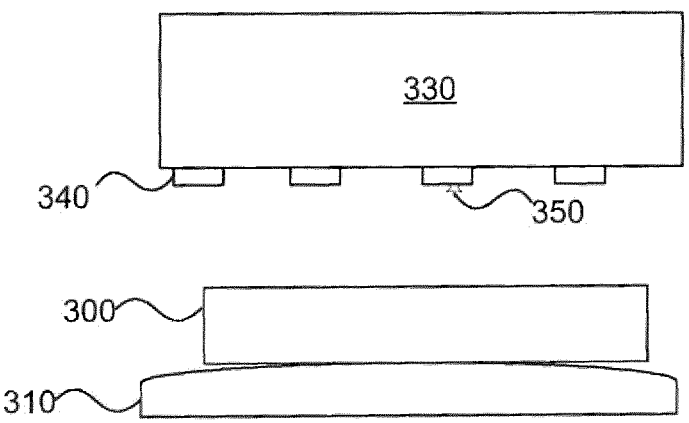
FIG. 5 is a not-to-scale diagram of a reticle and a reticle clamp according to an aspect of an embodiment.

One possible way to safely increase the compressive force is introducing a geometry at the clamp/cleaning reticle interface that has positive curvature (convex or higher in middle than at the periphery) rather than the sag in the cleaning reticle 300 shown in FIG. 2. This can be accomplished in a number of ways. For example, it can be accomplished by using a contoured pod base plate as shown in FIG. 3. Thus, reticle sag can be removed to increase compressive forces. The base can be configured to support the reticle 300 not just at its periphery but also in sections closer to and at its middle portion. The base can also be configured to have a positive curvature as shown in FIG. 3 so that the support for the middle portions is higher than the support at the periphery. Thus, in the arrangement shown in FIG.3 there are protrusions 360 in the middle section of the base that are higher than the protrusions 320 at the periphery. There may also be protrusions of intermediate size such as protrusions 370 positioned between the central protrusions 360 and the peripheral protrusions 320. Another alternative is that the entire surface of the base can be supplied with a positive curvature. This is shown in FIG. 5.

Figure 4A:
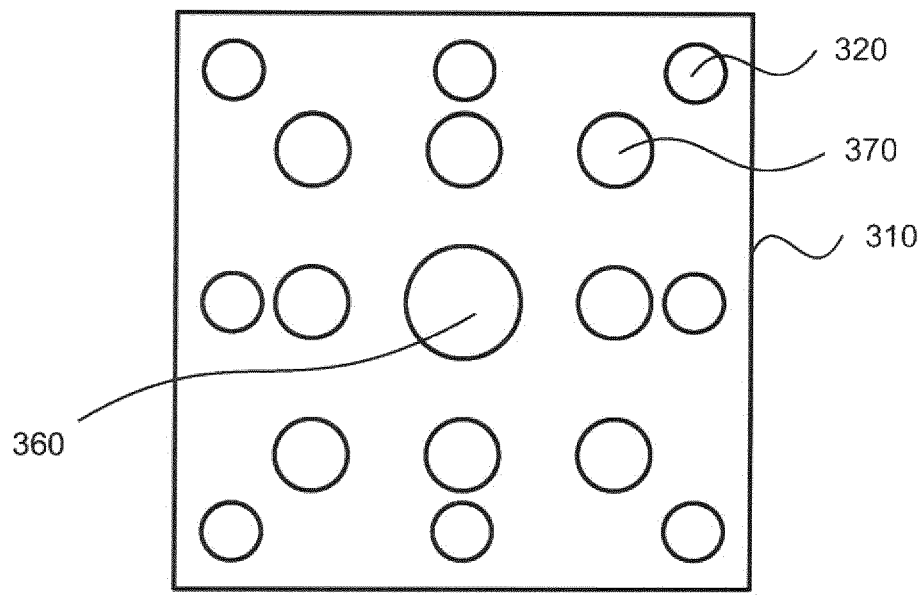
FIGS. 4A and 4B are not-to-scale plan views of bases for a reticle exchange device according to an aspect of an embodiment.
Figure 4B:
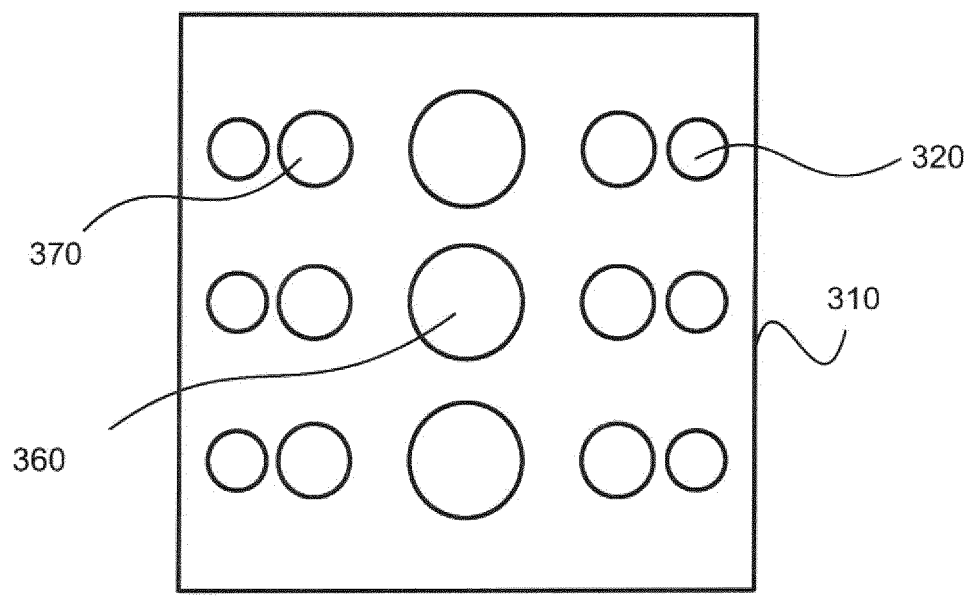

There are various arrangements of protrusions on the base that satisfy the criterion of enabling increased compressive force between the reticle and the reticle clamp. One such configuration is shown in FIG. 4A in which the protrusions are arranged on the base in a pattern that is symmetric with regard to both the width and length of the base. FIG. 4B shows a pattern that has translational symmetry. The patterns and the number of protrusions that provide higher support towards the center of the reticle are arbitrary. These contouring protrusions may be made of a quartz piezoelectric material and have a rounded profile to permit essentially spherical contact. The protrusions may be integral with the base or formed on the base.

Figure 6:
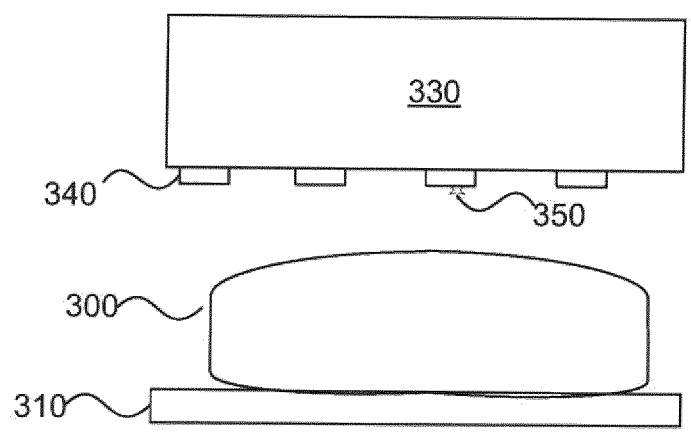
FIG. 6 is a not-to-scale diagram of a reticle and a reticle clamp according to an aspect of an embodiment.
Figure 7:
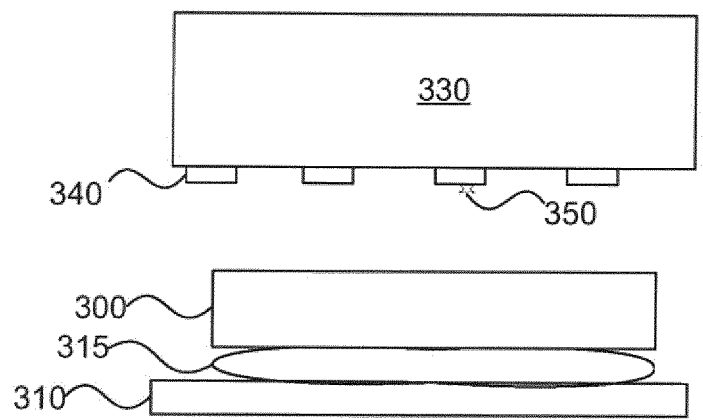
FIG. 7 is a not-to-scale diagram of a reticle and a reticle clamp according to an aspect of an embodiment.

Another way to introduce positive curvature is to design a cleaning reticle that has one or both surfaces that are positively curved rather than planar. This is shown in FIG. 6.

Another way to introduce positive curvature is to place an insert 315 between the reticle base 310 and the cleaning reticle 300, with the insert 315 having one or both surfaces that are positively curved rather than planar. This is shown in FIG. 6.

While these features are described separately, they can be used singly or in combination to achieve the overall desired effect of imparting a positive net curvature to the top surface (that is, the surface confronting the clamp) of the cleaning reticle.

In use, the clamp can be "rolled over" the reticle, or, equivalently, the combination of the clamp and reticle can be rolled over the base. A short stroke of the clamp permits the clamp to roll over the reticle. The actuators/servos for the clamp permit movement with six degrees of freedom. The amount of force exerted on the reticle by the clamp may be controlled using a force feedback loop, or it can be controlled by controlling the position of the clamp. In current configurations the roll or tilt can be about a plus or minus 6% deviation from horizontal.

Figure 8A:
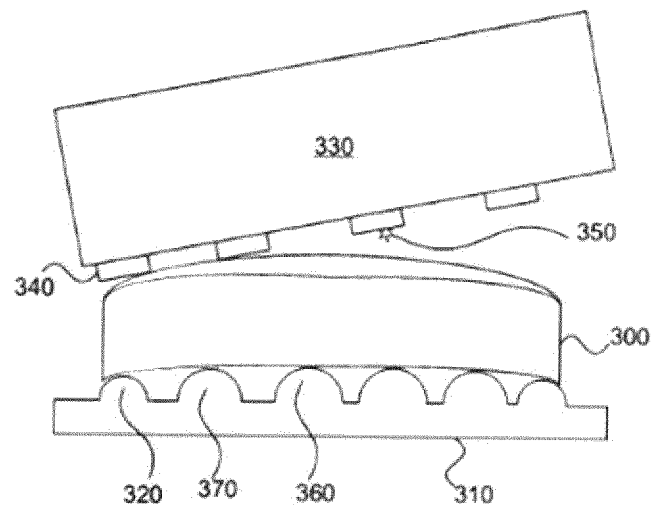
FIGS. 8A and 8B are not-to-scale diagrams illustrating the use of a cleaning substrate for removing a contaminant from a working surface according to an aspect of an embodiment.
Figure 8B:
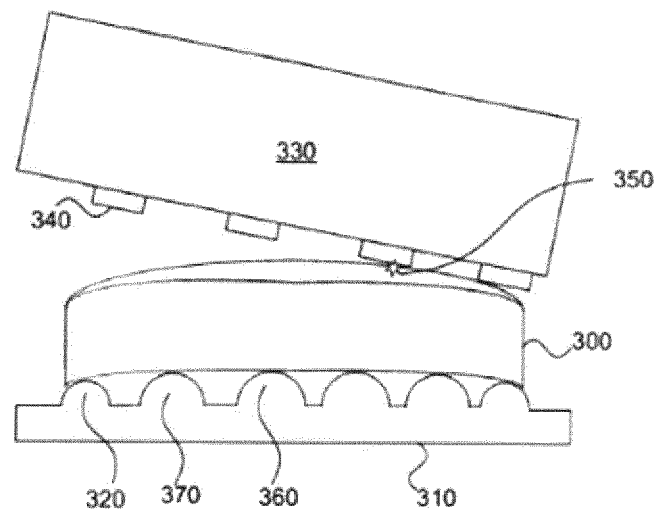
Figure 9:
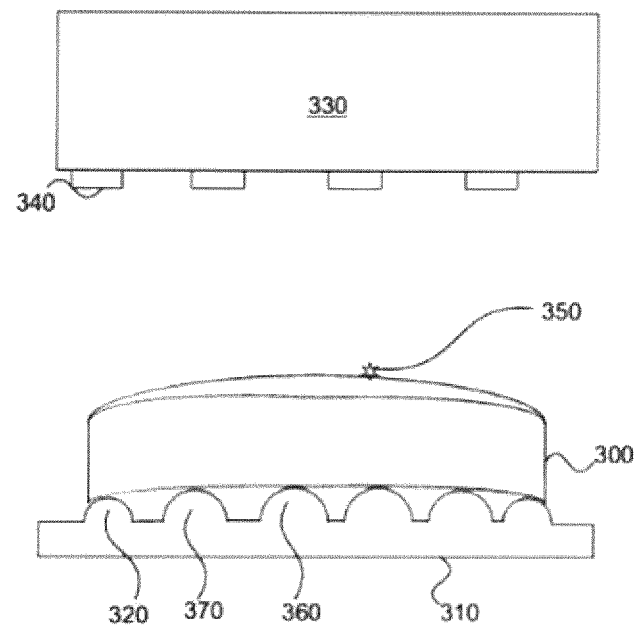
FIG. 9 is a not-to-scale diagram illustrating the results of use of a cleaning substrate for removing a contaminant from a working surface according to an aspect of an embodiment.

FIG. 8A shows a manner of operation of cleaning a reticle clamp surface with the cleaning reticle using a contoured base plate to support the cleaning reticle. The reticle clamp 330 is brought into contact with the cleaning reticle 300. The servos or actuators of the reticle clamp 330 then "rock" the reticle clamp across the surface of the cleaning reticle 300. FIG. 8A shows the reticle clamp 330 tilted so that the portion of the reticle clamp 330 in left hand side in the figure is pressing down on the left hand side of the reticle 300. The cleaning reticle 300 is then rotated into the position shown in FIG. 8B. In the process, increased compressive force is applied at the interface between the reticle clamp 330 and the cleaning reticle 300. As shown in FIG. 9, this causes the particle 350 to transfer from the reticle clamp 330 to the cleaning reticle 300.

The motion of the reticle clamp 330 with respect to the cleaning reticle 300 can be programmed for a variety of patterns, all referred to as "rocking" herein. The motion could be a simple tilting back and forth in multiple directions or the motion could involve an angular component. It is also possible to clamp the cleaning reticle 300 onto the reticle clamp 330 as part of this process in which case the rocking would occur between the bottom surface of the reticle 300 and the pod base.

The above description is primarily in terms of removing contaminants in the form of particles, but contamination can take other physical forms as well. For example, contamination can be in the form of a monolayers (contamination before it builds up sufficiently to be regarded as a particles) or stain/residues. The particles can be byproducts of use or unwanted remnants from manufacturing. The teachings of this disclosure may be applied to facilitate removal of all of these types of contaminants.

As mentioned, this process can be performed in situ, for example, in a tool the process can be used to remove chromium from a reticle stage. Alternatively, the process may be carried out for initial testing of parts.

With regard to the cleaning reticle, it may be a substrate that is specifically designed to effect cleaning and may be one use (sacrificial) or reusable. For example, it may have a coating made up of material such as aluminum which forms a surface layer of aluminum oxide. In operation the particle 350 may penetrate the surface layer and come in contact with the coating. Due to both the mechanical action of the particle 350 penetrating the surface layer and the choice of material for the coating the particle 350 dislodges from the clamp surface and transfers to the substrate. It is not necessary, however, for the contaminant to "punch through" the surface layer. For example, the bulk material (for example, aluminum) beneath the surface layer may be relatively ductile, allowing the surface layer (for example, aluminum oxide) to flex and conform to the contaminant to entrap it. It is thus desirable that material for the coating exhibit a low yield strength so that the particle may penetrate the coating, yield strength being the stress at which a specific amount of plastic deformation is produced.

It is desirable for some applications that the material for the coating have a higher bond dissociation energy for the material one wishes to pull away from the working surface than does the working surface. This means that chemically the particle 350 will tend to adhere to the material of the coating in preference to the working surface. It is also desirable that the material for some applications that the coating have a high Hamaker constant, the Hamaker constant being a material constant that measures the relative strength of the attractive van der Waals forces between two surfaces, here, the surface of the particle and the surface of the coating as experienced through the layer.

Figure 10:
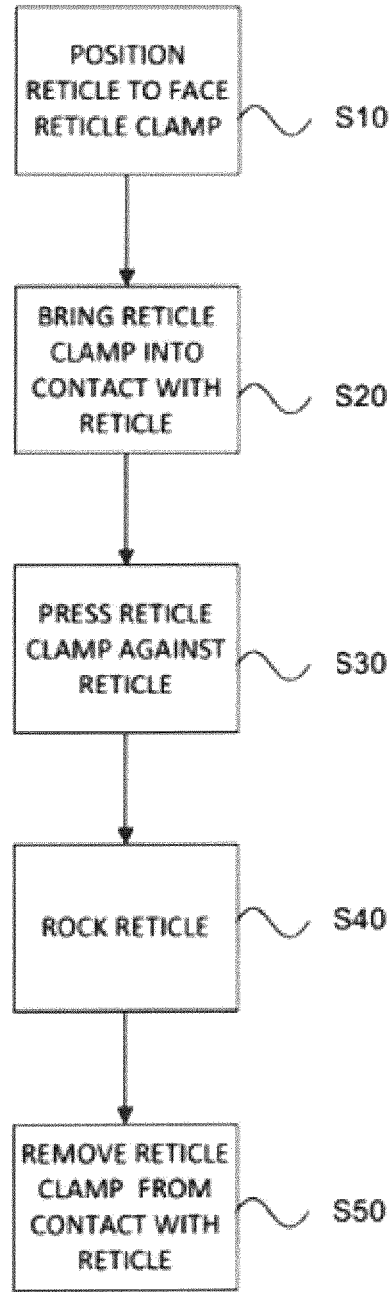
FIG. 10 is a flowchart illustrating a process for removing contaminants from a working surface according to an aspect of an embodiment.

FIG. 10 is a flowchart showing a process of cleaning a working surface using a cleaning substrate as described above. In a step S10 the reticle is positioned to face the working surface of the reticle clamp. In a step S20 the reticle clamp is brought into contact with the reticle. In a step S30 the servos controlling the position of the reticle clamp press the reticle clamp against the reticle. In a step S40 the servos rock the reticle clamp causing a line of contact between the reticle clamp and the reticle to move with a large amount of compressive force being applied along the line of contact. As mentioned, this rocking motion may be a simple tilting back and forth in various directions or may be more complicated. In a step S50 the reticle clamp is moved away from contact with the reticle.

Figure 11:
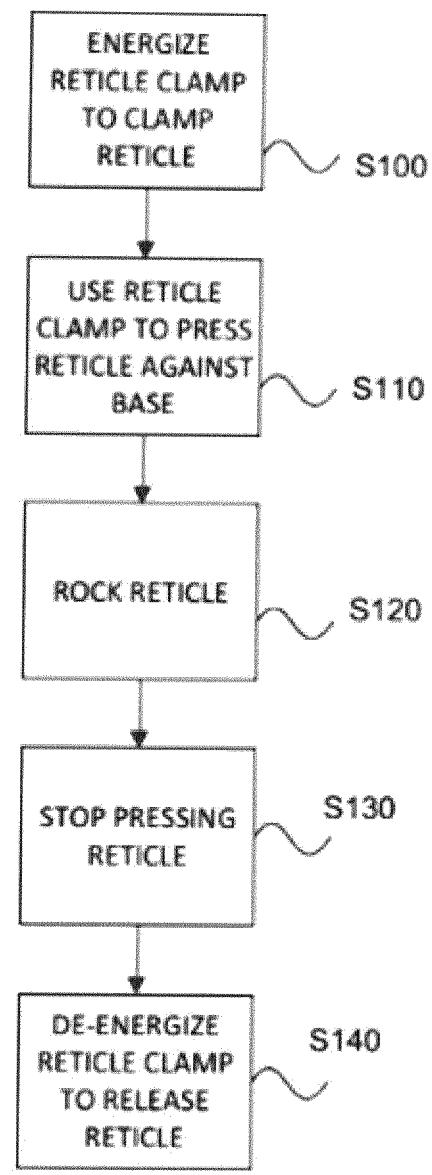
FIG. 11 is a flowchart illustrating a process for removing contaminants from a working surface according to an aspect of an embodiment.

FIG. 11 shows a process in which the reticle is a electrostatically clamped to the reticle clamp as part of the cleaning process. It will be understood that prior to the steps shown in the flowchart the reticle has been moved into position where it faces the reticle clamp. Then, in a step S100 the reticle clamp is energized to clamp the reticle. In a step S110, the servos or actuators of the reticle clamp press the combination of the reticle clamp with the reticle against the base of the pod. In a step S120 the combination of the reticle clamp and reticle is rocked with respect to the base. This causes an increased compressive force at the interface between the reticle clamp and the reticle. Again, this rocking motion can assume any one of a number of patterns. In step S130 the compressive force is relieved. In step S140 the reticle clamp is de-energized to release the reticle.

As for the duration of the rocking step, the force can be applied for a duration that is known to provide sufficient cleaning. Alternatively, of the condition of the working surface of the reticle clamp can be monitored during application of force and the force can be continued until it is determined that the working surface is sufficiently free of contamination.

The embodiments may further be described using the following clauses:

1. In a system for generating radiation for use in photolithography, an apparatus comprising a base arranged to support a substrate on a first surface of the base, the first surface being configured to have a surface profile that is higher at a middle portion of the first surface than at a laterally peripheral portion of the first surface.
2. Apparatus of clause 1 wherein the base is a part of a substrate transport module.
3. Apparatus of clause 1 wherein the surface profile comprises a first protrusion at a first position at a middle portion of the first surface and a second protrusion at a second position between the first protrusion and a laterally peripheral portion of the first surface, the base having a first thickness at the first protrusion and a second thickness at the second protrusion, the first thickness being greater than the second thickness.
4. Apparatus of clause 2 wherein the first protrusion is configured to provide a spherical contact with the substrate.
5. Apparatus of clause 2 wherein the first protrusion and the second protrusion have a substantially hemispherical cross section.
6. Apparatus of clause 1 wherein the surface contour comprises a first protrusion at a first position at a middle portion of the first surface, a second protrusion at a second position between the first protrusion and a laterally peripheral portion of the first surface, and a third protrusion at a third position between the second protrusion and a laterally peripheral portion of the first surface, the base having a first thickness at the first protrusion, a second thickness at the second protrusion, and a third thickness at the third protrusion, the first thickness being greater than the second thickness and the second thickness being greater than the third thickness.
7. Apparatus of any one of clauses 1-6 wherein the first protrusion is integral with the base.
8. Apparatus of any one of clauses 1-7 wherein the first protrusion is formed on the base.
9. Apparatus of any one of clauses 1-8 further comprising a clamping structure and an actuator mechanically coupled to the clamping structure, the actuator being configured to be able to apply a compressive force to the clamping structure with respect to the base and to be able to tilt the clamping structure with respect to the base.

10. Apparatus of any one of clauses 1-9 wherein the working surface comprises a reticle stage and the cleaning substrate comprises a cleaning reticle.

11. In a system for generating radiation for use in photolithography, an apparatus comprising a substrate, a base arranged to support the substrate on a first surface of the base, the substrate being supported in a manner such that a middle portion of a top surface of the substrate extends vertically farther from the base than a peripheral portion of the substrate.

12. Apparatus of clause 11 wherein the base has positive curvature.

13. Apparatus of clause 11 or 12 wherein at least one surface of the substrate has positive curvature.

14. Apparatus of any one of clauses 11-13 further comprising an insert placed between the substrate and the base, at least one lateral surface of the insert having positive curvature.

15. A method of removing a contaminant from a working surface of a clamping structure in a photolithography tool, the method comprising the steps of:
supporting a substrate on a working surface of a base, the first surface being configured to have a surface profile that is higher at a middle portion of the first surface than at a laterally peripheral portion of the first surface;
compressing the substrate between the base and the working surface;
rocking the working surface with respect to the base; and
withdrawing the substrate away from the working surface.

16. A method of clause 15 wherein the working surface comprises a reticle stage and the cleaning substrate comprises a cleaning reticle.

17. A method of clause 15 or 16 wherein the base is a part of a substrate transport module.

18. A method of any one of clauses 15-17 wherein the clamping structure is mechanically coupled to an actuator mechanically coupled to the clamping structure and wherein:
the step of compressing the substrate between the base and the working surface comprises causing the actuator to apply a compressive force to the clamping structure with respect to the base; and
the step of rocking the working surface with respect to the base comprises causing the actuator to repeatedly tilt the clamping structure with respect to the base.

19. A method of any one of clauses 15-18 further comprising a step between the compressing step and the rocking step of activating the clamp to secure the substrate to the clamp.

20. A method of any one of clauses 15-19 wherein the rocking step is carried out for a period of time known to be effective to remove a sufficient amount of contaminant.

21. A method of any one of clauses 15-20 wherein the working surface is located in a vacuum chamber and wherein the method further comprises the steps of:
a step, before the compressing step, of moving the cleaning substrate to a position adjacent to the working surface and
a step, after the withdrawing step, of repositioning the cleaning substrate to a position where the cleaning substrate can be unloaded.

22. A method of any one of clauses 15-21 wherein the step of compressing the substrate between the base and the working surface comprises controlling an amount of force exerted on the substrate using a force feedback loop.

23. A method of any one of clauses 15-22 wherein the step of compressing the substrate between the base and the working surface comprises controlling the position of the clamp.

24. A method of removing a contaminant from a working surface of a clamping structure in a photolithography tool, the method comprising the steps of:
supporting a substrate on a working surface of a base such that a central portion of a combination of the substrate and the base is thicker at a center of the combination that at a peripheral portion of the combination;
compressing the substrate between the base and the working surface;
rocking the working surface with respect to the base; and
withdrawing the substrate away from the working surface.

25. A method of clause 24 wherein the base has a positive curvature.

26. A method of clause 24 wherein at least one surface of the substrate has positive curvature.

27. A method of clause 24 wherein the supporting step comprises placing an insert between the substrate and the base, the insert having at least one surface with positive curvature.

28. A method of any one of clauses 24-27 wherein the working surface comprises a reticle stage and the cleaning substrate comprises a cleaning reticle.

29. A method of any one of clauses 24-28 wherein the base is a part of a substrate transport module.

30. A method of any one of clauses 24-29 wherein the clamping structure is mechanically coupled to an actuator mechanically coupled to the clamping structure and wherein:
the step of compressing the substrate between the base and the working surface comprises causing the actuator to apply a compressive force to the clamping structure with respect to the base; and
the step of rocking the working surface with respect to the base comprises causing the actuator to repeatedly tilt the clamping structure with respect to the base.

31. A method of any one of clauses 24-30 further comprising a step between the compressing step and the rocking step of activating the clamp to secure the substrate to the clamp.

32. A method of any one of clauses 24-31 wherein the rocking step is carried out for a period of time known to be effective to remove a sufficient amount of contaminant.

33. A method of any one of clauses 24-32 wherein the working surface is located in a vacuum chamber and wherein the method further comprises the steps of:
a step, before the compressing step, of moving the cleaning substrate to a position adjacent to the working surface and
a step, after the withdrawing step, of repositioning the cleaning substrate to a position where the cleaning substrate can be unloaded.

34. A method of any one of clauses 24-33 wherein the step of compressing the substrate between the base and the working surface comprises controlling an amount of force exerted on the substrate using a force feedback loop.

35. A method of any one of clauses 24-35 wherein the step of compressing the substrate between the base and the working surface comprises controlling the position of the clamp.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The invention claimed is:

1. An apparatus for use in a system for generating radiation for photolithography, the apparatus comprising:
    a base arranged to support a substrate on a first surface of the base, the first surface being configured to have a surface profile that is higher at a middle portion of the first surface than at a laterally peripheral portion of the first surface; and
    a clamping structure configured to make contact with the substrate,
    wherein the clamping structure is configured to tilt with respect to the base, such that the clamping structure exerts a force on the substrate, and
    wherein an insert is disposed between the substrate and the base, at least one lateral surface of the insert having convex curvature.

2. The apparatus of claim 1, wherein the base is a part of a substrate transport module.

3. The apparatus of claim 1, wherein the surface profile comprises a first protrusion at a first position at the middle portion of the first surface and a second protrusion at a second position between the first protrusion and the laterally peripheral portion of the first surface, the base having a first thickness at the first protrusion and a second thickness at the second protrusion, the first thickness being greater than the second thickness.

4. The apparatus of claim 3, wherein the first protrusion is configured to provide a spherical contact with the substrate.

5. The apparatus of claim 3, wherein the first protrusion and the second protrusion have a substantially hemispherical cross section.

6. The apparatus of claim 1, wherein the surface profile comprises a first protrusion at a first position at the middle portion of the first surface, a second protrusion at a second position between the first protrusion and the laterally peripheral portion of the first surface, and a third protrusion at a third position between the second protrusion and the laterally peripheral portion of the first surface, the base having a first thickness at the first protrusion, a second thickness at the second protrusion, and a third thickness at the third protrusion, the first thickness being greater than the second thickness and the second thickness being greater than the third thickness.

7. The apparatus of claim 3, wherein the first protrusion is integral with the base.

8. The apparatus of claim 3, wherein the first protrusion is formed on the base.

9. The apparatus of claim 1, wherein the substrate comprises a cleaning reticle.

10. An apparatus for use in a system for generating radiation for photolithography, the apparatus comprising:
    a substrate;
    a base arranged to support the substrate on a first surface of the base, the substrate being supported in a manner such that a middle portion of a top surface of the substrate extends vertically farther from the base than a peripheral portion of the substrate; and
    a clamping structure configured to make contact with the substrate,
    wherein the clamping structure is configured to tilt with respect to the base such that the clamping structure exerts a force on the substrate, and
    wherein an insert is disposed between the substrate and the base, at least one lateral surface of the insert having convex curvature.

11. The apparatus of claim 10, wherein the base has convex curvature.

12. The apparatus of claim 10, wherein at least one surface of the substrate has convex curvature.

* * * * *

UNITED STATES PATENT AND TRADEMARK OFFICE
CERTIFICATE OF CORRECTION

PATENT NO. : 12,117,737 B2
APPLICATION NO. : 17/418487
DATED : October 15, 2024
INVENTOR(S) : Levy Page 1 of 1

It is certified that error appears in the above-identified patent and that said Letters Patent is hereby corrected as shown below:

On the Title Page

Column 2, Item (57), under "Abstract", Line 4, delete "abase" and insert -- a base --, therefor.

Column 2, Item (57), under "Abstract", Line 7, delete "base the" and insert -- base of the --, therefor.

Signed and Sealed this
Fourth Day of February, 2025

Coke Morgan Stewart
*Acting Director of the United States Patent and Trademark Office*